(12) United States Patent
Angkititrakul et al.

(10) Patent No.: US 9,089,083 B2
(45) Date of Patent: Jul. 21, 2015

(54) AC-DC CONVERTER FOR WIDE RANGE OUTPUT VOLTAGE AND HIGH SWITCHING FREQUENCY

(71) Applicant: AVOGY, INC., San Jose, CA (US)

(72) Inventors: Sitthipong Angkititrakul, Fremont, CA (US); Hemal N. Shah, San Mateo, CA (US)

(*) Notice: Subject to any disclaimer, the term of this patent is extended or adjusted under 35 U.S.C. 154(b) by 227 days.

(21) Appl. No.: 13/692,717

(22) Filed: Dec. 3, 2012

(65) Prior Publication Data

US 2014/0153304 A1    Jun. 5, 2014

(51) Int. Cl.
*H02M 7/06* (2006.01)
*H05K 13/00* (2006.01)
*H02M 1/42* (2007.01)
*H02M 1/12* (2006.01)

(52) U.S. Cl.
CPC ............ *H05K 13/00* (2013.01); *H02M 1/4208* (2013.01); *H02M 1/126* (2013.01); *Y02B 70/126* (2013.01); *Y10T 29/49117* (2015.01)

(58) Field of Classification Search
USPC ........... 363/34, 35, 37, 44, 45, 46, 47, 48, 52, 363/53, 61, 76, 81, 82, 84, 86, 88, 89, 90, 363/123, 124, 125, 126, 127, 157, 159; 323/207
See application file for complete search history.

(56) References Cited

U.S. PATENT DOCUMENTS

| | | | |
|---|---|---|---|
| 8,289,737 B2 * | 10/2012 | Wildash | 363/44 |
| 2012/0044729 A1 * | 2/2012 | Coleman et al. | 363/126 |
| 2013/0077365 A1 * | 3/2013 | Chalermboon et al. | 363/89 |

* cited by examiner

*Primary Examiner* — Nguyen Tran
(74) *Attorney, Agent, or Firm* — Kilpatrick Townsend & Stockton LLP

(57) ABSTRACT

An electrical circuit includes an input for an AC input voltage coupled to a first inductive element with first and second outputs coupled to respective first and second nodes, and a four-quadrant (4-Q) switch coupled between the first and second nodes. A capacitor is coupled between the first node and a third node, a second inductive element is coupled between the third node and the second node, and a first bidirectional device and a first diode are coupled in series between a positive output node and a negative output node. A first output of the second inductive element is coupled between the first bidirectional device and the first diode. A second bidirectional device and a second diode are coupled in series between the positive output node and the negative output node. A second output of the second inductive element is coupled between the second bidirectional device and the second diode.

16 Claims, 11 Drawing Sheets

AC-DC CONVERTER FOR WIDE RANGE OUTPUT VOLTAGE AND HIGH SWITCHING FREQUENCY

Power electronics are widely used in a variety of applications. Power electronic circuits are commonly used to convert the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to power converter. More specifically, the present invention relates to an AC-DC converter that can provide a wide range of output voltages and/or operate at relatively high frequencies. Merely by way of example, the invention can be employed as a power factor correction (PFC) circuit. The circuits and techniques described herein can be utilized in a wide variety of applications, such as an AC-DC power supply for a computer server, an AC-DC power supply for a battery charger, and the like.

An embodiment of electrical circuit, according to the disclosure, can include an input operable to receive an AC input voltage, a first inductive element coupled to the input and having first and second outputs coupled to respective first and second nodes, and a four-quadrant (4-Q) switch coupled between the first and second nodes. The electrical circuit can also include a capacitor coupled between the first node and a third node, a second inductive element coupled between the third node and the second node, and a first bidirectional device and a first diode coupled in series between a positive output node and a negative output node. A first output of the second inductive element can be coupled between the first bidirectional device and the first diode. The electrical circuit can finally include a second bidirectional device and a second diode coupled in series between the positive output node and the negative output node. A second output of the second inductive element can be coupled between the second bidirectional device and the second diode.

An embodiment of a method of manufacturing an electrical circuit, according to the disclosure, can include providing a first inductive element operable to receive an AC input voltage and having first and second outputs comprising respective first and second nodes, coupling a four-quadrant (4-Q) switch between the first and second nodes, and coupling a capacitor between the first node and a third node. The method can further include coupling a second inductive element between the third node and the second node, coupling a first bidirectional device and a first diode in series between a positive output node and a negative output node, and coupling a first output of the second inductive element between the first bidirectional device and the first diode. The method can also include coupling a second bidirectional device and a second diode in series between the positive output node and the negative output node, and coupling a second output of the second inductive element between the second bidirectional device and the second diode.

An embodiment of an AC-DC converter, according to the disclosure, can include a coupled inductor operable to receive an AC input voltage and having first and second outputs coupled to respective first and second nodes, and a first switch coupled between the first and second nodes. The first switch can be operable to block voltage in two directions in an off state, and conduct current in two directions in an on state. The AC-DC converter can also include a capacitor coupled between the first node and a third node, and an inductive element coupled between the third node and the second node, where the inductive element has a first output and a second output. The AC-DC converter can also include a second switch and a first diode coupled in series between a first output node and a second output node. The first output of the inductive element can be coupled between the second switch and the first diode. The AC-DC converter can also include a third switch and a second diode coupled in series between the first output node and the second output node. The second output of the inductive element can coupled between the third switch and the second diode. Each of the second and third switches can be operable to block voltage in two directions in an off state, and conduct current in one direction in an on state.

Numerous benefits are achieved by way of the present invention over conventional techniques using boost or flyback topologies. For PFC using boost topology, the output DC voltage level must be higher than the peak AC input. For PFC using flyback topology, its pulsating input current requires more filters to meet EMC requirement. The embodiments of the present invention enable DC output voltage to be regulated at wider voltage level, including voltages higher and/or lower than the peak AC input voltage. Techniques provided herein further allow for continuous input current, which can yield low current distortion. These and other embodiments of the invention, along with many of its advantages and features, are described in more detail in conjunction with the text below and attached figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

The present invention relates generally to electronic devices. More specifically, the present invention relates to providing a single-phase AC-DC converter with a wide range of output voltage and a high switching frequency. Techniques disclosed herein utilize a single-ended primary inductor converter (SEPIC) topology to enable the AC-DC converter to regulate a DC output voltage within a wide range of voltages, which can be higher or lower than the peak AC input voltage. The invention can be utilized in a variety of applications such as, for example, a power supply for a computer server, a power supply for a battery charger, and the like.

Figure 1:
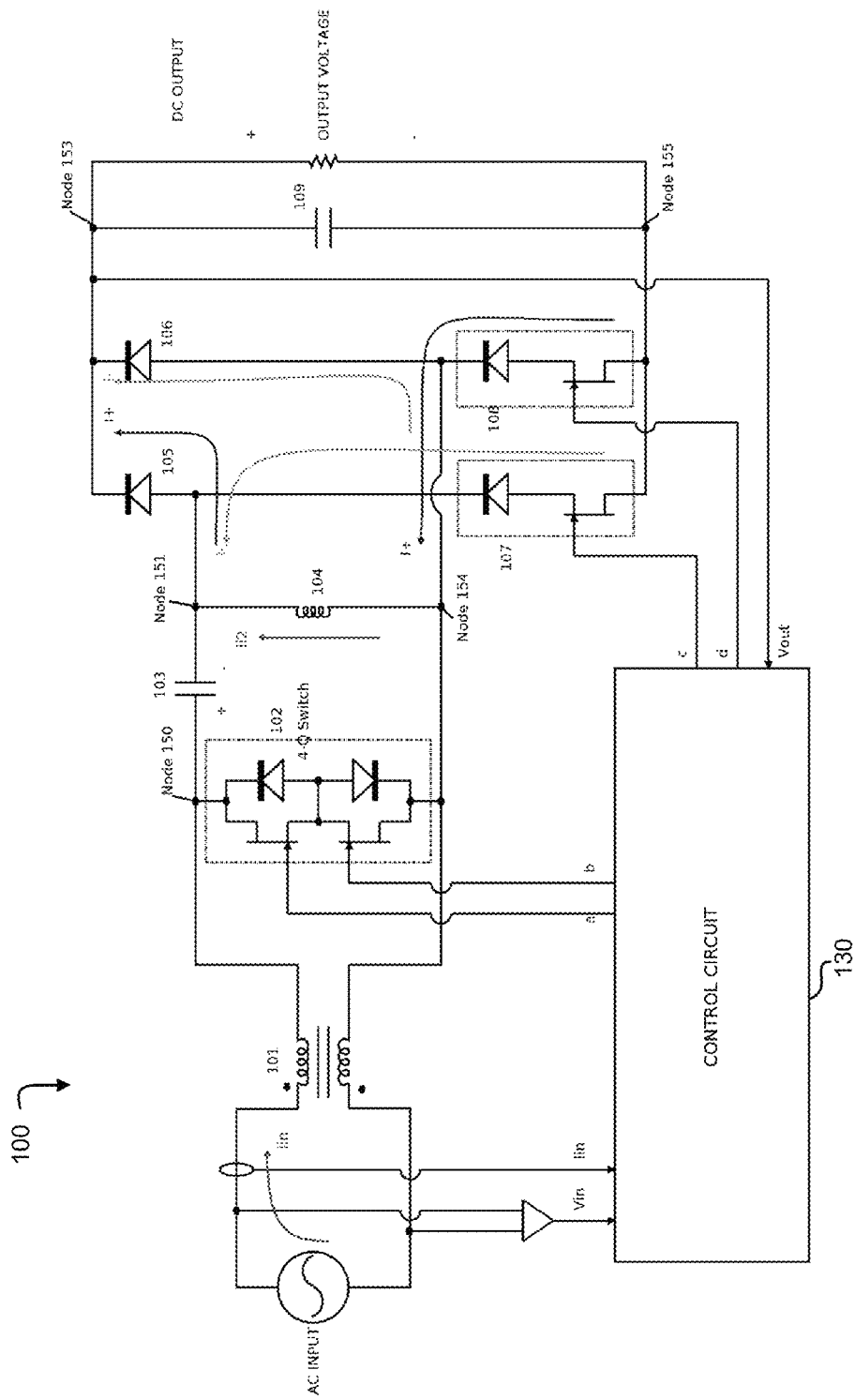
FIG. 1 is a schematic diagram illustrating an AC-DC converter circuit, according to one embodiment of the present invention.

FIG. 1 is a schematic diagram illustrating an AC-DC converter circuit 100, according to one embodiment. Here, an AC input voltage can be provided at input nodes of a coupled-inductor 101, and a DC output voltage is generated between an output node 153 and an output node 155. The embodiment includes a coupled-inductor 101, an inductor 104, a four-quadrant (4-Q) switch 102, an AC capacitor 103, a DC capacitor 109, diodes 105 and 106, and two voltage-bidirectional two-quadrant switches 107 and 108. Embodiments shown in FIG. 1 and elsewhere herein are provided as non-limiting examples. One of ordinary skill in the art would recognize many variations, modifications, and alternatives to the components provided herein.

The 4-Q switch 102, connected between node 150 and node 154, is a switch capable of conducting current in both positive and negative directions when switched on. When switched off, the 4-Q switch 102 can block both positive and negative voltages. The embodiment shown in FIG. 1 has a 4-Q switch 102 with two control-signal inputs, comprising two transistors and two diodes. However, the components and architecture of the 4-Q switch 102 can vary, depending on desired functionality and other concerns. Embodiments utilizing an alternative 4-Q switch are included herein below. An AC capacitor 103, connected to node 150 and node 151, separates one end of the 4-Q switch 102 from the inductor 104.

The voltage-bidirectional two-quadrant switches 107 and 108 are switches that are capable of conducting current in one direction when switched on. When switched off, the voltage-bidirectional two-quadrant switches 107 and 108 can block both positive and negative voltages. The voltage-bidirectional two-quadrant switches 107 and 108 shown in FIG. 1 have a transistor coupled in series with a diode. However, similar to the 4-Q switch 102, the components and architecture of the voltage-bidirectional two-quadrant switches 107 and 108 can vary depending on desired functionality and other concerns.

A control circuit 130, a typical pulse width modulation (PWM) circuit, can be utilized to sense the AC input voltage $V_{in}$ and/or AC input current $I_{in}$ and control the 4-Q switch 102 and voltage-bidirectional two-quadrant switches 107 and 108 accordingly. As discussed in more detail below, the control circuit 130 can control the switches 102, 107, and 108 such that the input current $I_{in}$ substantially follows the waveform of the AC input voltage $V_{in}$, such that the circuit can be used as the power factor correction circuit. Additionally, in some embodiments, the control circuit 130 also can sense the DC output voltage $V_{out}$ to provide feedback to help ensure the desired DC output voltage $V_{out}$ is achieved.

Values for the various components can vary depending on desired functionality and/or other factors. According to some embodiments, for example, values for the inductive element 101 can be between 50 and 5,000 µH; values for the inductor 104 can be between 50 and 5,000 µH; values for the capacitor 103 can be between 0.01 and 1 µF; and values for the capacitor 109 can be between 1 and 100 µF. Other embodiments may include values outside these ranges. One of ordinary skill in the art would recognize many variations, modifications, and alternatives.

To enable the AC-DC converter circuit 100 to operate in high-power applications at a high switching frequency, specialized components can be utilized. For example, the switching devices, transistors and diodes, utilized in the switches 102, 107, and 108 can be devices based on a wide bandgap material, such as gallium nitride (GaN) or silicon carbide (SiC). This can enable the AC-DC converter circuit 100 to operate at higher voltages, higher temperatures, and higher frequencies than solution using traditional silicon-based devices. For universal ac input voltage, 90-265 Vrms, with a frequency of between 50 and 60 Hz, the present invention with GaN-based devices can be operated with switching frequencies up to 2 MHz. Other embodiments may include frequencies and/or voltages outside these ranges.

For AC-DC converter as a PFC pre-regulation circuit, the input current $I_{in}$ waveform is controlled to follow the ac input voltage, while regulating the dc voltage between the output nodes. The state of operation of the AC-DC converter circuit 100 depends on the polarity of the AC input voltage. During the positive AC cycle, the input current $I_{in}$ flows into the converter. The current through the inductor 104 (indicated by the arrow labeled $I_{l2}$ in FIG. 1) is positive. the voltage-bidirectional two-quadrant switch 108 is turned on while the voltage-bidirectional two-quadrant switch 107 is turned off, allowing current to flow through the voltage-bidirectional two-quadrant switch 108 and diode 105 in the direction indicated by the arrows labeled I+ in FIG. 1. During this state, the voltage across the capacitor 103 is positive and approximately equals to the ac input voltage. In this state, current flows through node 150 to node 154 when the 4-Q switch is turned on. When the 4-Q switch is turned off, it blocks positive voltage from node 150 to node 154.

During a negative AC cycle (i.e., when the AC input has a negative polarity), the input current $I_{in}$ must flows out of the converter. The current through the inductor 104 (indicated by the arrow labeled $I_{l2}$ in FIG. 1) is negative. The voltage across the capacitor 103 is also negative and approximately equals to the ac input voltage. In this state, the voltage-bidirectional the voltage-bidirectional two-quadrant switch 107 is turned on while the voltage-bidirectional two-quadrant switch 108 is turned off, allowing current to flow through the voltage-bidirectional two-quadrant switch 107 and diode 106 in the direction indicated by the arrows labeled I− in FIG. 1. In this state, current flows through node 154 to node 150 when the 4-Q switch is turned on. When the 4-Q switch is turned off, it blocks negative voltage from node 150 to node 154.

Figure 2:
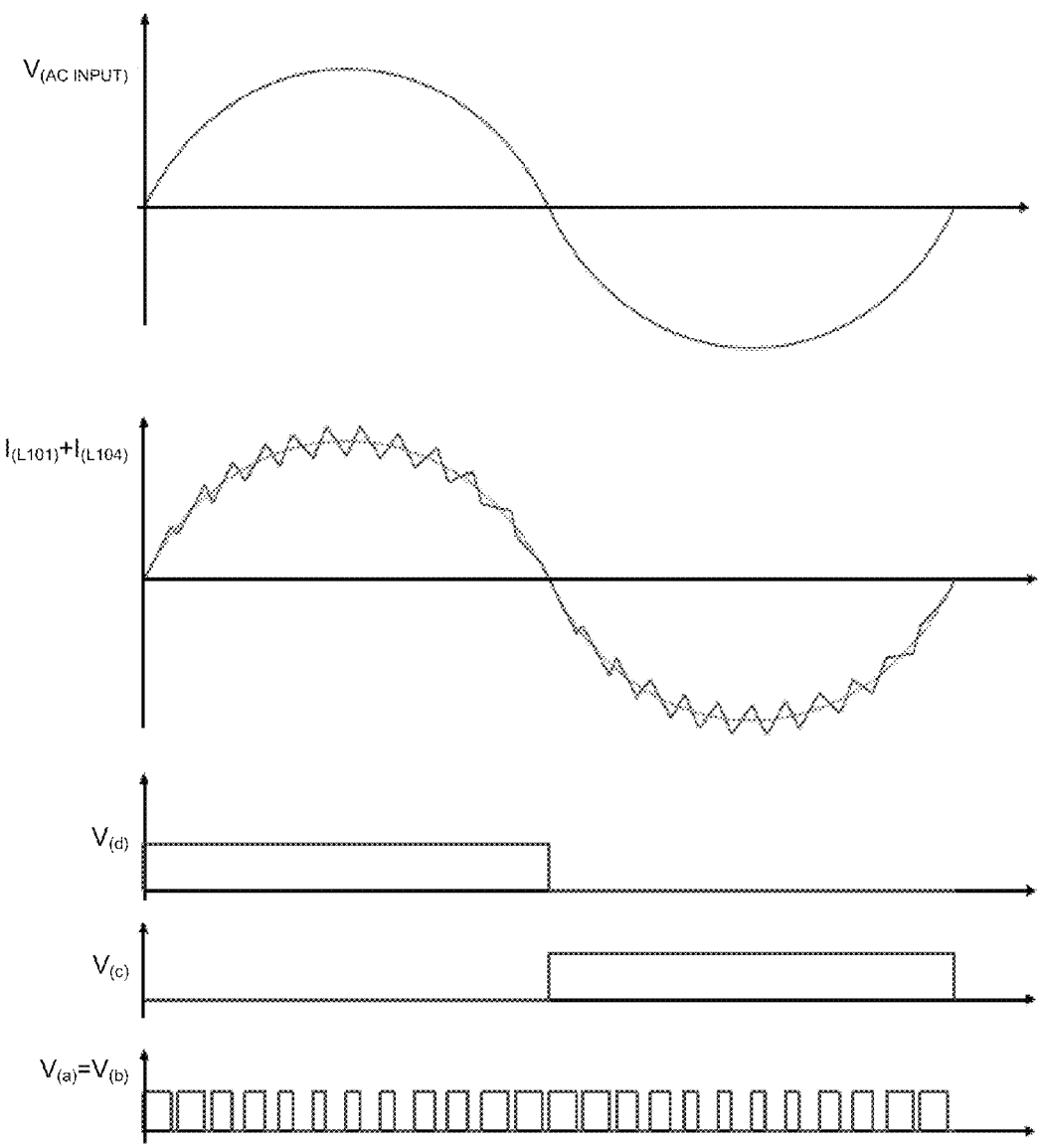
FIG. 2 is a timing diagram illustrating example voltages and currents at different nodes of the AC-DC converter circuit of FIG. 1 during a single period of a sinusoidal AC input voltage.

FIG. 2 is a timing diagram illustrating example voltages and currents at different nodes of the AC-DC converter circuit 100 of FIG. 1 during a single period of a sinusoidal AC input voltage, labeled $V_{(AC\ INPUT)}$. As shown, current through the inductive elements 101 and 104, labeled $I_{(L101)}+I_{(L104)}$, substantially follows the sinusoidal waveform of the AC input voltage. The overall waveform of the current traces a sinusoid correlating to the AC input voltage, while a ripple current corresponds to pulse-width modulation of the 4-Q switch 102, driven by voltages $V_{(a)}$ and $V_{(b)}$ at respective a and b outputs of the control circuit 130 (shown in FIG. 1). As indicated in FIG. 2, the duty cycle of the pulse-width modulation can vary within a single period of the AC input.

To reduce switching losses in the drive circuits for the voltage-bidirectional two-quadrant switches 107 and 108, the switches 107 and 108 can be operated at the ac input frequency. During the positive AC cycle, voltage $V_{(d)}$ at output d of the control circuit 130 turns on the voltage-bidirectional two-quadrant switch 108, while the voltage $V_{(c)}$ at output c of the control circuit turns the voltage-bidirectional two-quadrant switch 107 off. During the negative AC cycle, the opposite is true: voltage $V_{(d)}$ turns off the voltage-bidirectional two-quadrant switch 108, and the voltage $V_{(c)}$ turns the voltage-bidirectional two-quadrant switch 107 on.

Figure 3:
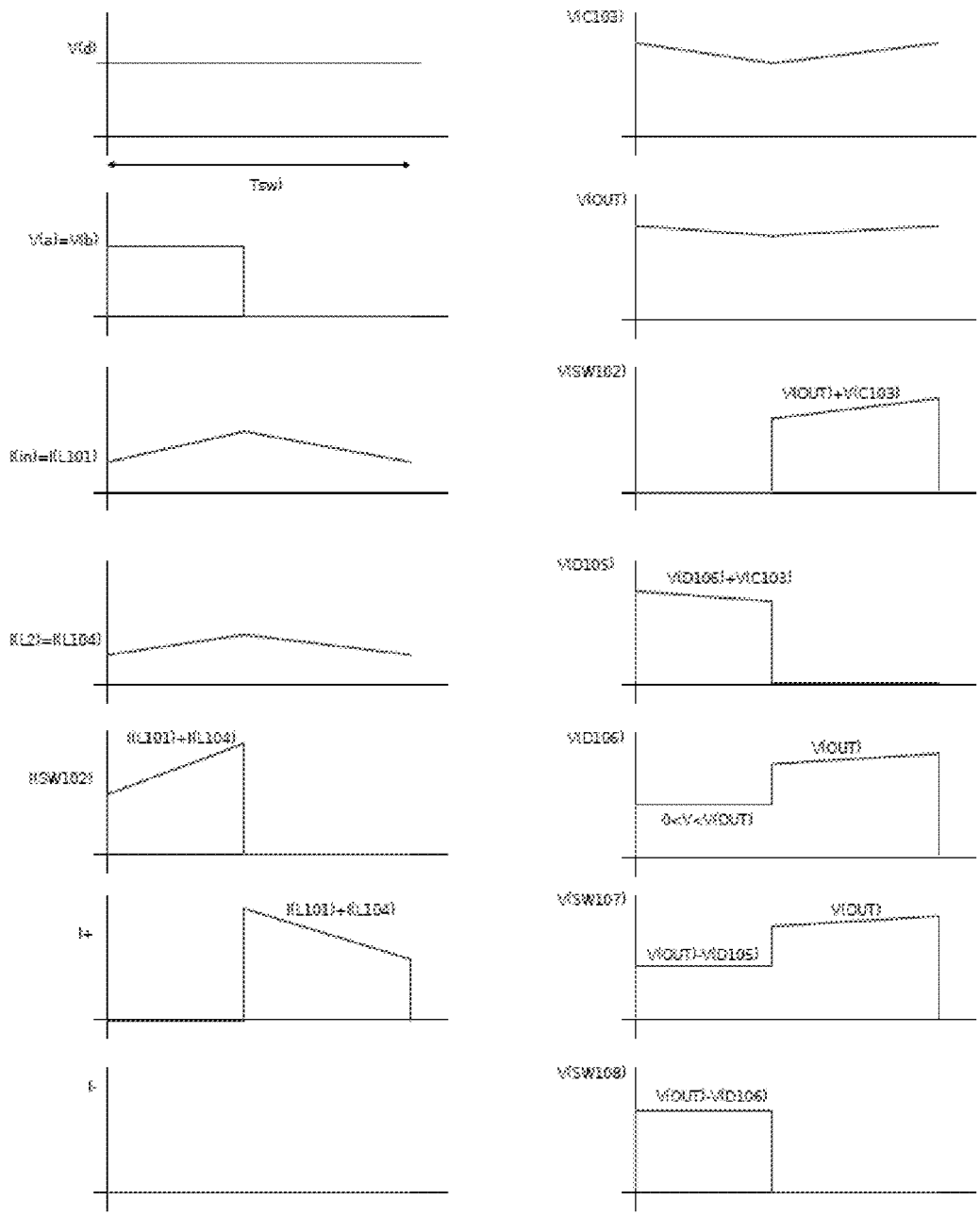
FIGS. 3-4 are example timing diagrams for voltages and currents at different nodes of the AC-DC converter circuit of FIG. 1 during a switching period of the four-quadrant (4-Q) switch.
Figure 4:
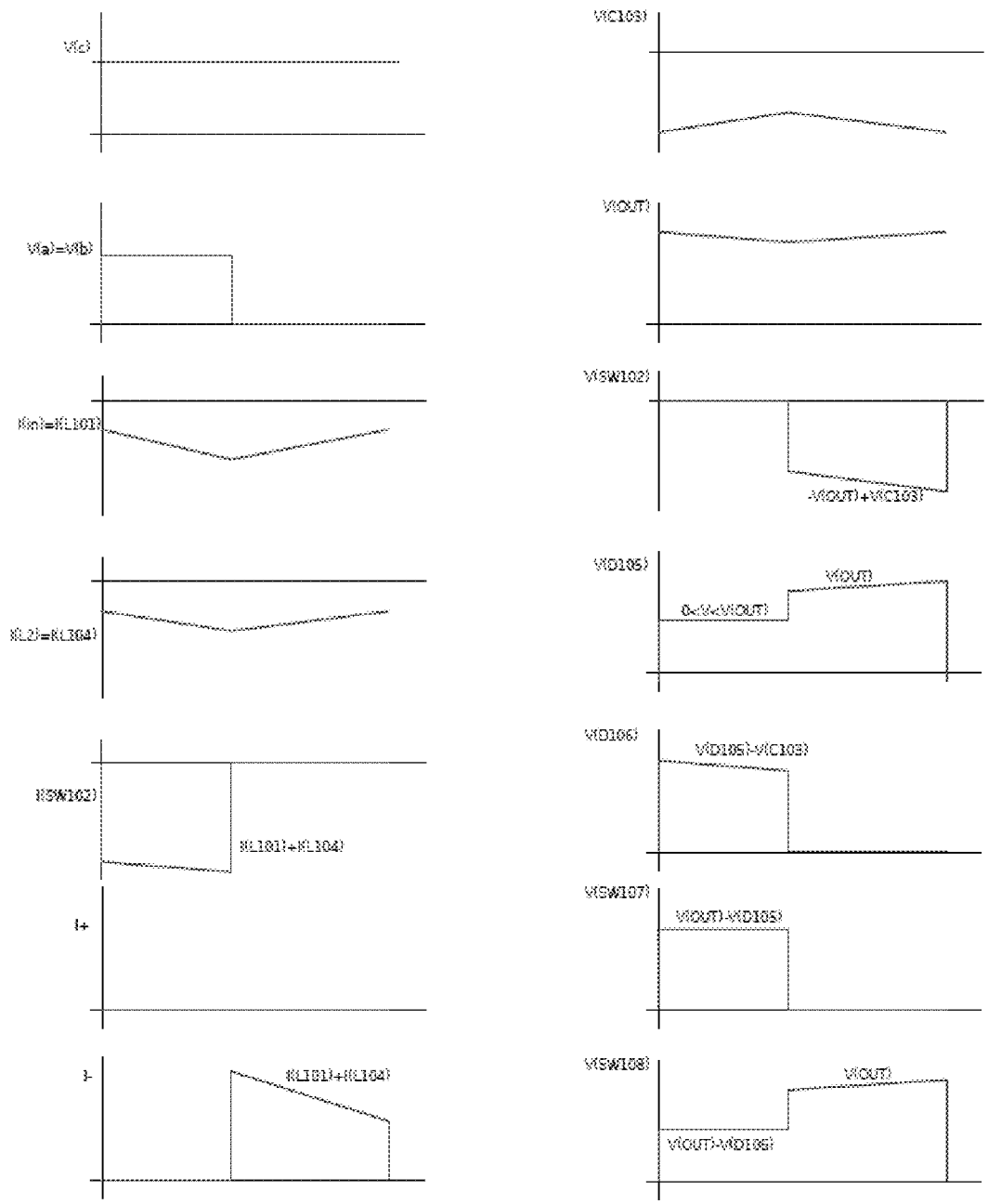

FIGS. 3 and 4 are example timing diagrams showing voltages and currents at different nodes of the AC-DC converter circuit 100 of FIG. 1 during a switching period $T_{(sw)}$ of the 4-Q switch 102. FIG. 3 shows example timing diagrams during a positive input AC cycle (e.g., when $V_{(AC\ INPUT)}$ (see FIG. 2) is greater than 0V). FIG. 4 shows example timing diagrams during a negative input AC cycle (e.g., when $V_{(AC\ INPUT)}$ is less than 0V). Although FIGS. 3 and 4 illustrate timing diagrams where a duty cycle for $V_{(a)}$ and $V_{(b)}$ is roughly 40%, the duty cycle can vary, as indicated previously. In these example timing diagrams, $$T_{(sw)} = \frac{1}{F_{(sw)}} \quad (1)$$

and $$F_{(sw)} \gg F_{(ac)}, \quad (2)$$

where $F_{(sw)}$ is the switching frequency of the 4-Q switch 102 and $F_{(sw)}$ is the frequency of the AC input voltage.

Referring to FIG. 3, in which the switching waveform in one switching period during the positive input AC cycle is shown, The control circuit keep $V_{(d)}$ high to turns on the transistor in the voltage-bidirectional two-quadrant switch 108. The 4-Q switch 102 is turned on with a duty cycle, D. When the 4-Q switch conducts, both input current $I_{(in)}=I_{(L101)}$ and current 42)=$I_{(L104)}$ through inductor 104 ramp up, and flow through the 4-Q switch 102. A positive voltage $V_{(C103)}$ across the capacitor 103, as well as the positive DC output voltage $V_{(OUT)}$, ramp down. The total blocking voltage of the diode 106 and the switch 108 equal to the output voltage; the diodes 106 blocks voltage between zero voltage and the output voltage, while the switch 108 blocks the remaining voltage. The diode 105 blocks voltage equal to the sum of the blocking voltage of the diode 106 and the voltage of the capacitor 103. The switch 107 blocks the voltage equal to the difference between the output voltage and the blocking voltage of the diode 105, which can be either positive or negative.

When the 4-Q switch is turned off, the combined currents $I_{(L101)}$ and $I_{(L104)}$ flows through the diode 105 and the voltage-bidirectional two-quadrant switch 108 as I+. The diode 106 and the voltage-bidirectional two-quadrant switch 107 block voltage equal to the output voltage. The 4-Q switch 102 blocks positive voltage equal to the sum of the voltage across capacitor 103 (approximately equal to the input voltage) and the output voltage.

Referring to FIG. 4, in which the switching waveform in one switching period during the negative input AC cycle is shown, The control circuit keep $V_{(c)}$ high to turns on the transistor in the voltage-bidirectional two-quadrant switch 107. The 4-Q switch 102 is turned on with a duty cycle, D. When the 4-Q switch conducts, both negative input current $I_{(in)}=I_{(L101)}$ and negative current $I_{(L2)}=I_{(L104)}$ through inductor 104 ramp up, and flow through the 4-Q switch. A negative voltage $V_{(C103)}$ across the capacitor 103, as well as the positive DC output voltage $V_{(OUT)}$, ramps down. The total blocking voltage of the diode 105 and the switch 107 equal to the output voltage; the diodes 105 blocks voltage between zero voltage and the output voltage, while the switch 107 blocks the remaining voltage. The diode 106 blocks voltage equal to the difference between the blocking voltage of the diode 105 and the voltage of the capacitor 103. Note that during this interval, the voltage across capacitor 103 is negative; therefore, the diode 106 only blocks positive voltage. The switch 108 blocks the voltage equal to the difference between the output voltage and the blocking voltage of the diode 106, which can be either positive or negative.

When the 4-Q switch is turned off, the combined currents $I_{(L101)}$ and $I_{(L104)}$ flows through the diode 106 and the voltage-bidirectional two-quadrant switch 107 as I−. The diode 105 and the voltage-bidirectional two-quadrant switch 108 block voltage equal to the output voltage. The 4-Q switch 102 blocks negative voltage equal to the sum of the voltage across capacitor 103 (approximately equal to the input voltage) and the output voltage.

It should be appreciated diagrams of FIGS. 3 and 4 are provided as non-limiting examples to illustrate the operation of the embodiment of the AC-DC converter circuit 100 shown in FIG. 1 under certain conditions. As indicated elsewhere herein, the 4-Q switch 102 can be switched at a different duty cycle, which would result in timing diagrams that would differ from those illustrated in FIGS. 3 and 4. Other variations could result from adjustments to the AC input voltage and/or frequency, desired DC output voltage, and/or 4-Q switching frequency. Furthermore, other embodiments may add, omit, and/or substitute components, which may cause alterations in operating voltages, currents, and/or other functionality. One of ordinary skill in the art would recognize many variations, modifications, and alternatives.

Figure 5:
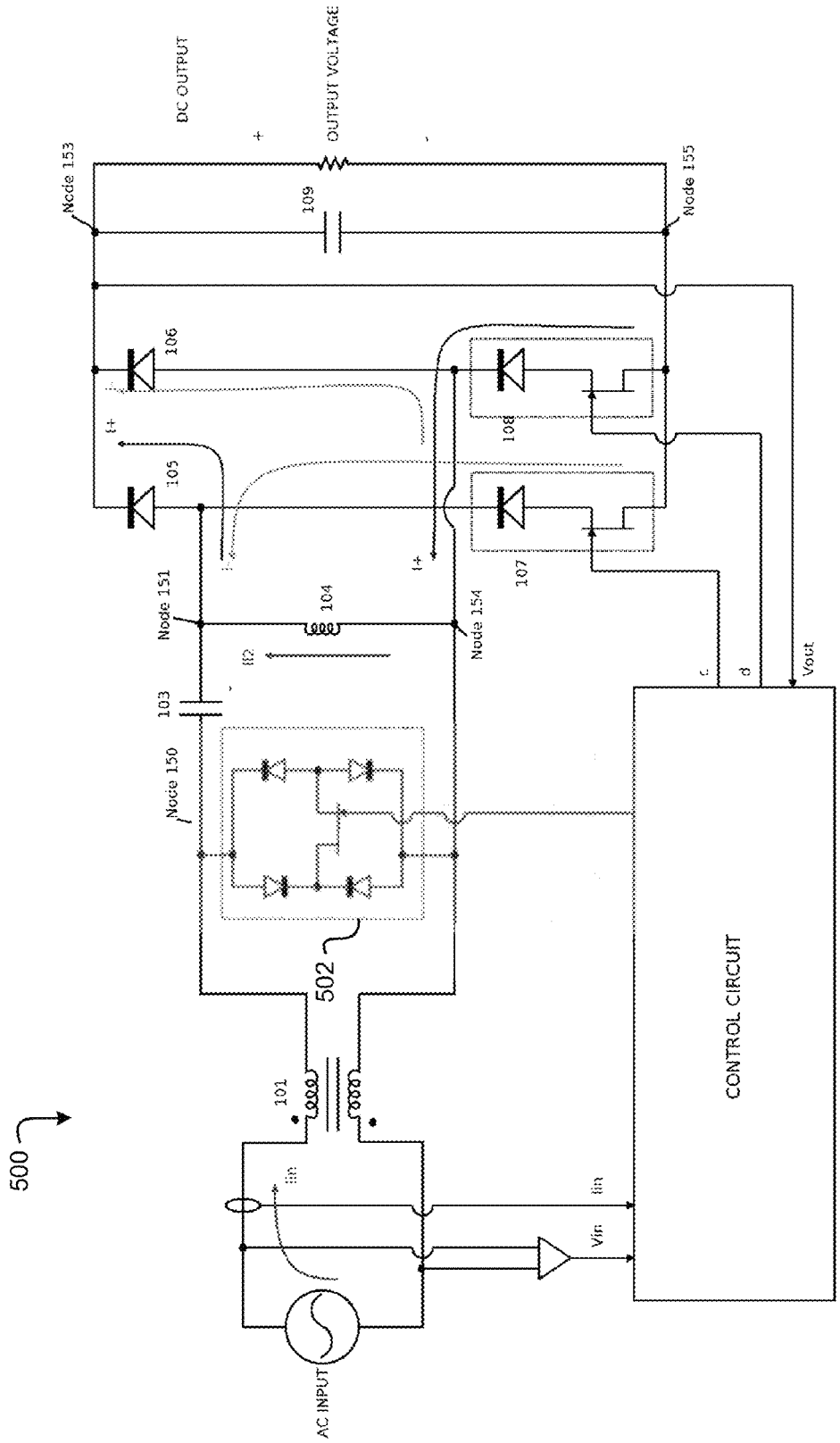
FIGS. 5-7 illustrate various other embodiments of an AC-DC converter circuit that utilize techniques disclosed herein.
Figure 6:
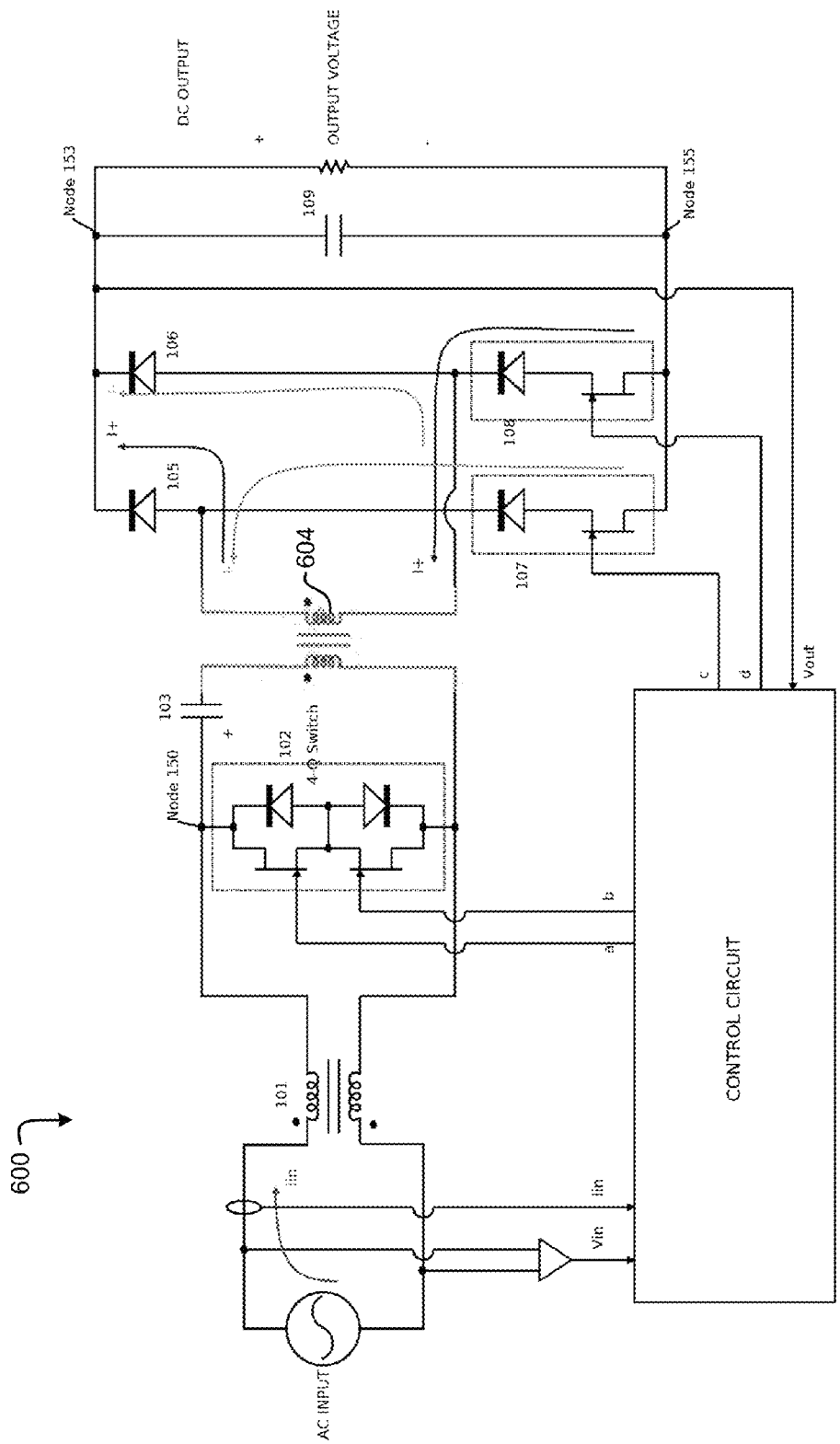
Figure 7:
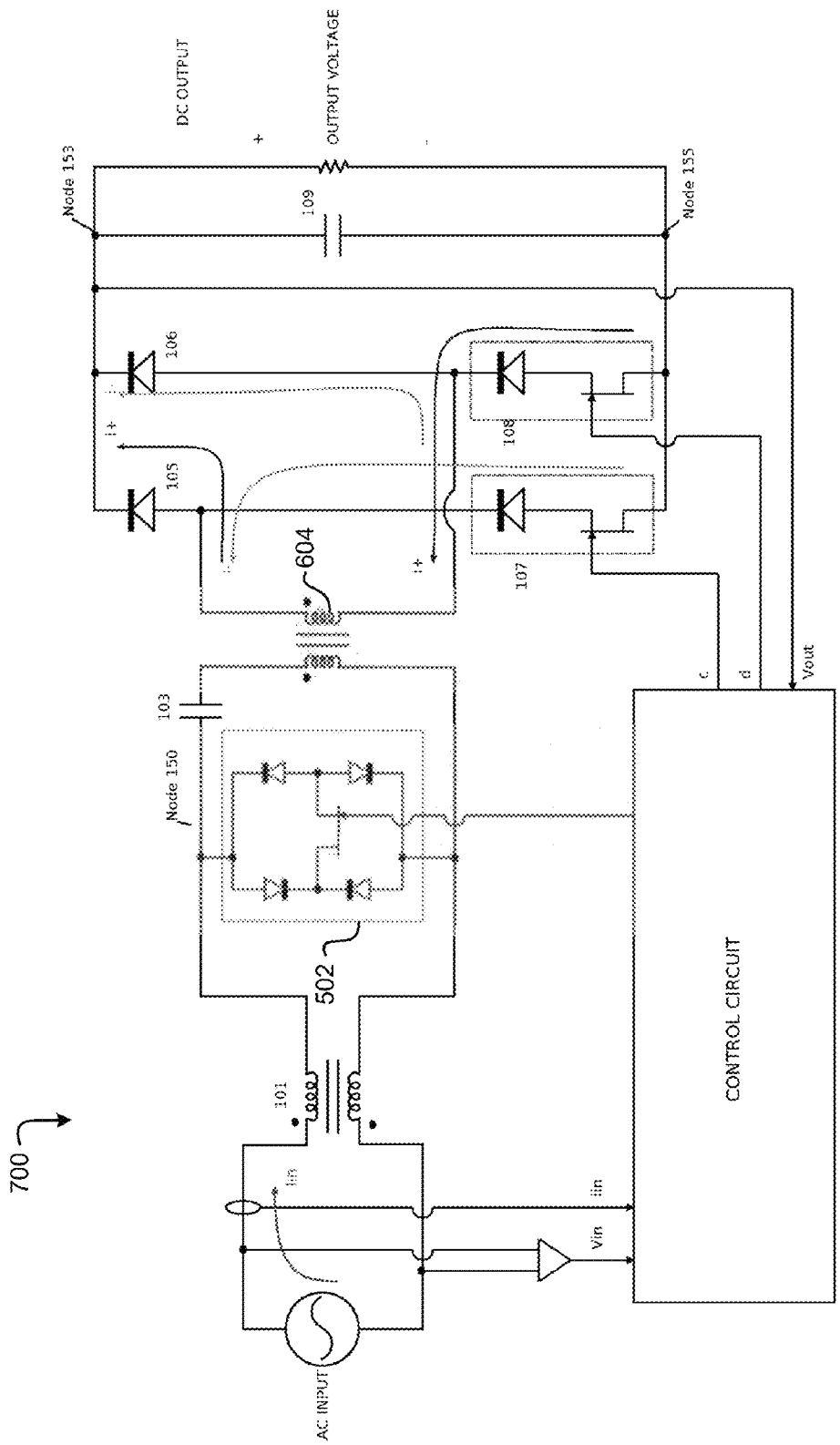

FIGS. 5-7 illustrate various other embodiments of an AC-DC converter circuit that utilize techniques disclosed herein. Again, the embodiments shown in these figures are non-limiting examples. Other embodiments may add, omit and/or substitute components, which may impact functionality. One of ordinary skill in the art would recognize many variations, modifications, and alternatives.

Referring to FIG. 5, the embodiment 500 shown includes a 4-Q switch 502 with 4 diodes and a single FET is used. Here, the FET is coupled between two pairs of diodes to enable the 4-Q switch 502 to be operated using a single input. As with other embodiments herein, the FET and/or diodes may be made of specialized materials such as GaN and/or SiC to accommodate high temperature, high power, and/or high frequency applications.

In FIG. 6, the embodiment 600 includes a coupled inductor 604 to provide electric isolation between AC input voltage 604 and DC output voltage. A similar to the inductor 104 of FIG. 1, a first winding of the coupled inductor 604 is coupled with a node to which capacitor 103 is connected, and a node to which 4-Q switch 102 and coupled inductor 101 are connected. A second winding is connected to nodes between voltage-bidirectional two-quadrant switches 107 and 108 and diodes 105 and 106, which are electrically isolated from the AC input voltage.

FIG. 7 illustrates an embodiment 700 with both the 4-Q switch 502 of FIG. 5 and the coupled inductor 604 of FIG. 6. Other embodiments may include various types of 4-Q switches, inductive elements, and/or other components.

Figure 8:
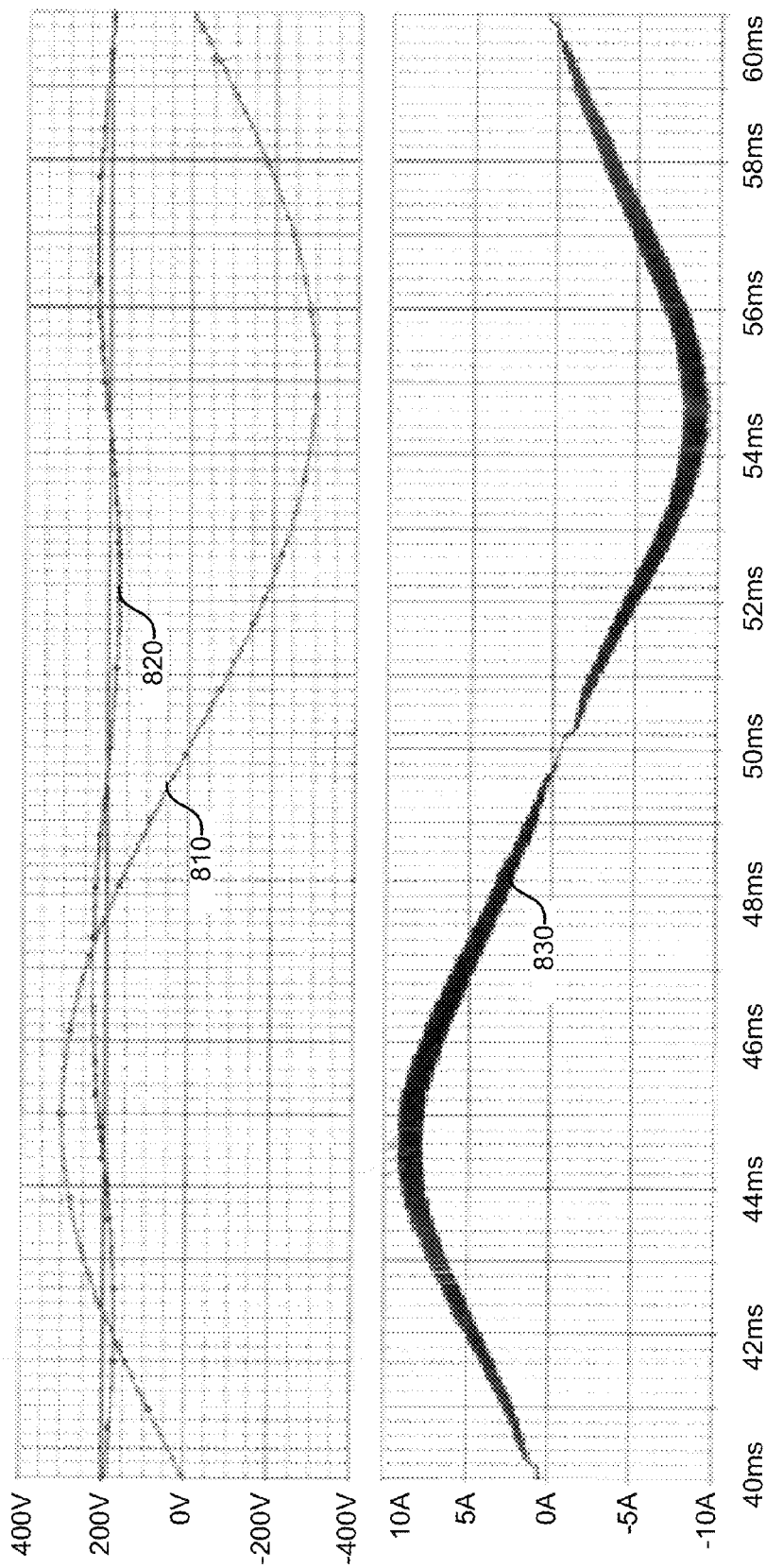
FIG. 8 includes two graphs illustrating simulated results from an embodiment under certain operating conditions.

FIG. 8 includes two graphs illustrating simulated results using PSPICE® software from an embodiment under certain operating conditions. In this simulation, a sinusoidal AC input voltage 810 is 220 Vrms with a frequency of 50 Hz. The resulting DC output voltage 820 is centered at approximately 200 V, with voltage ripple at twice the ac line frequency. The input current 830 substantially follows the waveform of the AC input voltage 810 and has a relatively high-frequency ripple current riding the larger sinusoidal waveform.

Figure 10:
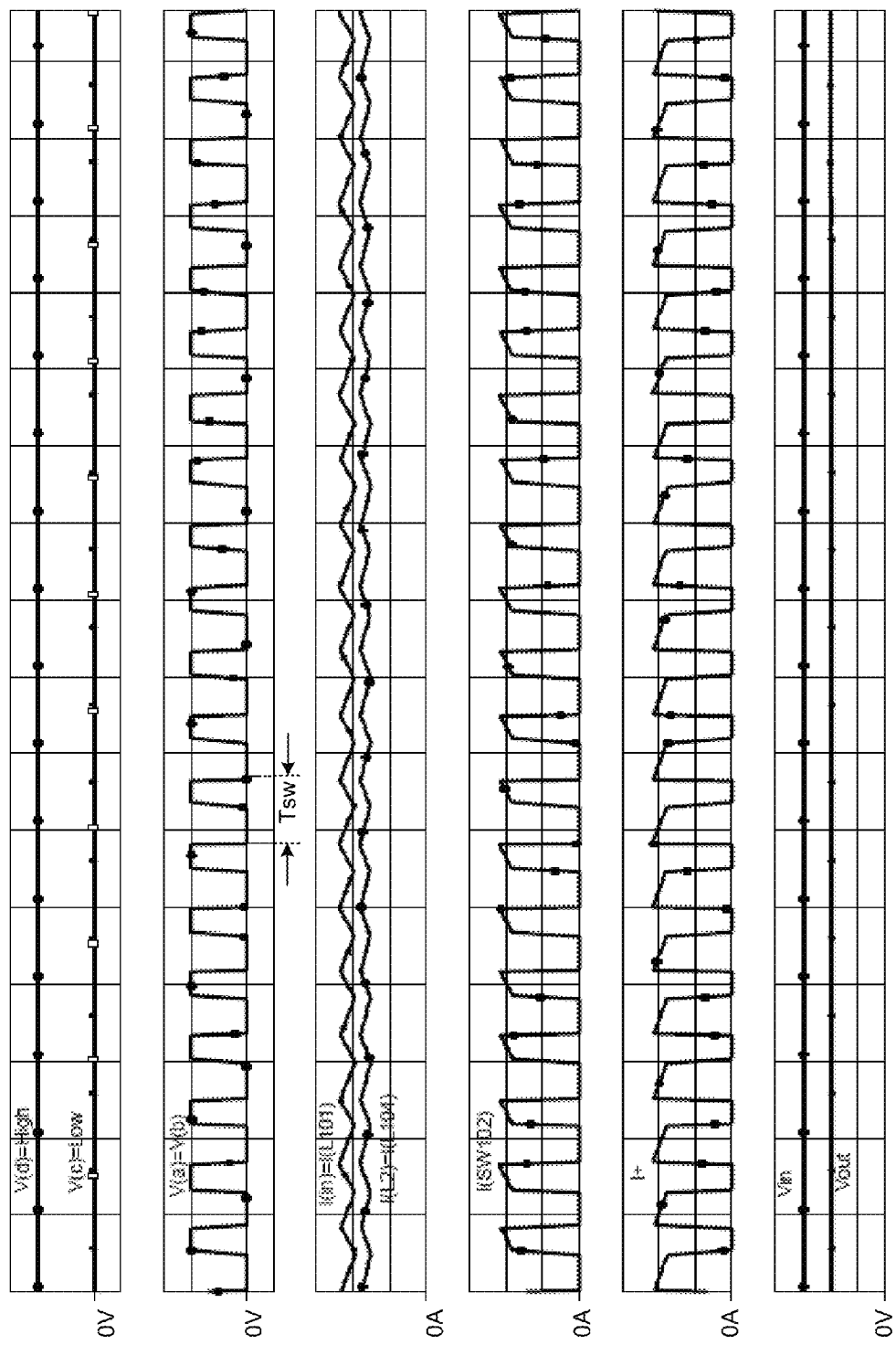
FIGS. 10 and 11 include simulation results using PSPICE® under conditions similar to those used in FIG. 8, showing waveforms for 20 switching periods.
Figure 11:
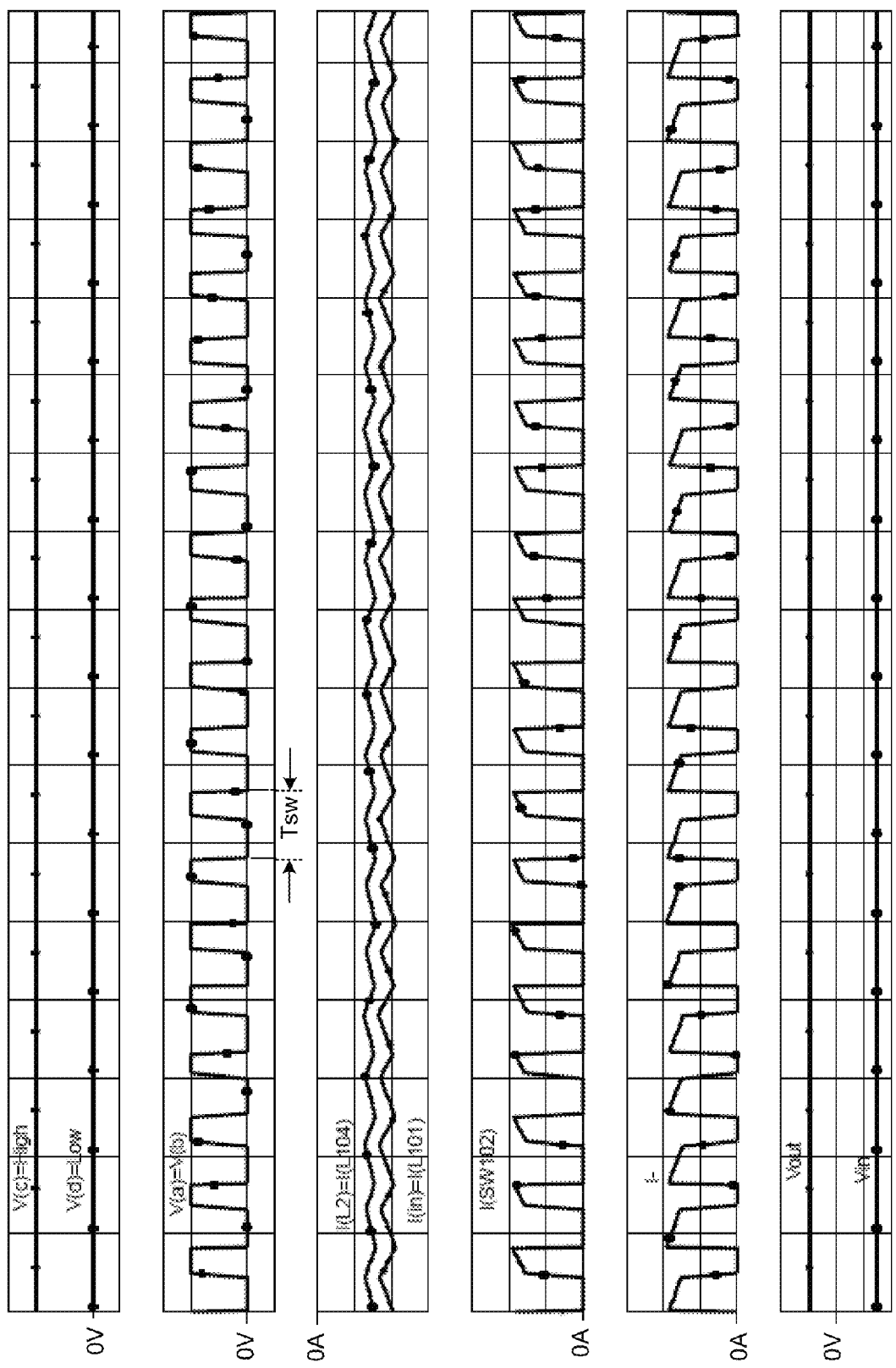

FIGS. 10 and 11 include simulation results using PSPICE® software under the same operating conditions as in FIG. 8, but in a much finer time scale, showing just 20 switching periods. FIG. 10 shows the simulation waveforms during the positive AC input voltage, which can correlate, for example, to a period of time between 44 and 46 ms shown in FIG. 8. In this example, because the switching period, $T_{sw}$, is approximately 3.33 μs (corresponding to a switching frequency of approximately 300 kHz), it is significantly smaller than AC input frequency. Thus, any variation in the input voltage, $V_{in}$, is not readily apparent. Wave patterns in these simulation results confirm expected wave patterns for a switching period shown in FIG. 3 where AC input voltage is positive. In a similar fashion, FIG. 11 shows the simulation waveforms during the negative AC input voltage, which can correlate, for example, to a period of time between 54 and 56 ms shown in FIG. 8. Wave patterns in these simulation results confirm expected wave patterns for a switching period shown in FIG. 4 where AC input voltage is negative. Wave patterns in other embodiments may vary, depending on implementation.

Figure 9:
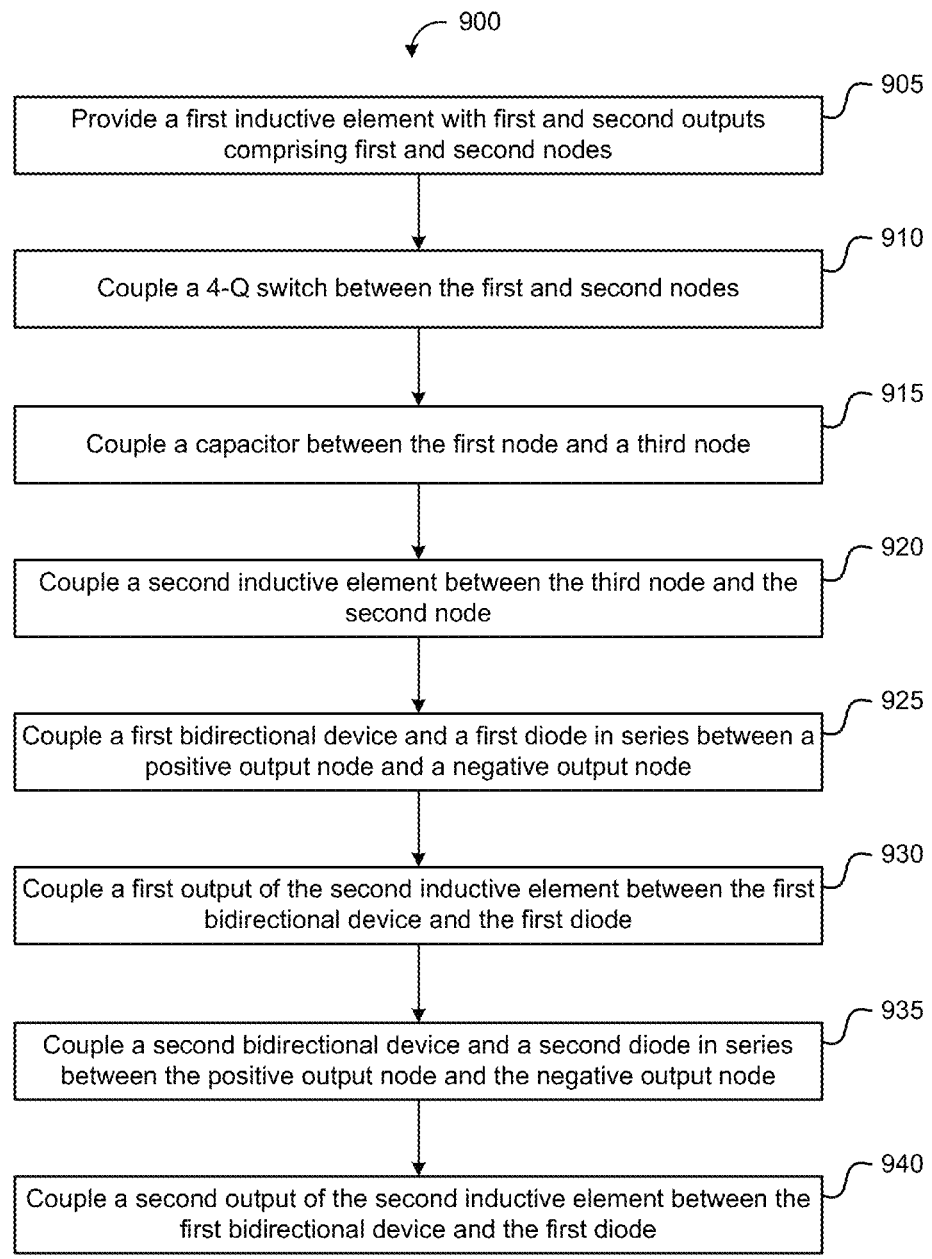
FIG. 9 is a flowchart illustrating a method of manufacturing an electrical circuit, according to an embodiment of the present invention.

FIG. 9 is a flowchart illustrating a method 900 of manufacturing an electrical circuit, according to an embodiment of the present invention. The method 900 can begin by providing a first inductive element with first and second outputs comprising first and second nodes (905). As shown in the embodiments described herein, the inductive element can be a coupled inductor operable to receive an AC input voltage.

A 4-Q switch is coupled between the first and second nodes (910). This 4-Q switch can include any of a variety of components, such as one or more FETs, diodes, and/or other electrical elements arranged to provide 4-Q switching functionality. According to some embodiments, the 4-Q switch may include SiC-based and/or GaN-based components to provide high voltage and/or high frequency functionality.

A capacitor is coupled between the first node and a third node (915), and a second inductive element is coupled between the third node and the second node (920). The values of these components can vary, depending on desired functionality. Furthermore, the inductive element may include any of a variety of inductive elements, such as coupled inductors (including transformers), inductors, and the like. In some embodiments, one or more additional inductive elements and/or other electrical components may be coupled between the third node and the second node.

A first bidirectional device and a first diode are coupled in series between a positive output node and a negative output node (925), and a first output of the second inductive element is coupled between the first bidirectional device and the first diode (930). Similarly, a second bidirectional device and a second diode are coupled in series between the positive output node and the negative output node (935), and a second output of the second inductive element is coupled between the second bidirectional device and the second diode (940). As indicated elsewhere herein, these bidirectional devices can be voltage-bidirectional two-quadrant switches that enable current to flow in one direction when turned on, but block voltage in both directions when turned off. Some embodiments may include coupling one or more additional electrical components (e.g., capacitors) between the positive output node and the negative output node.

It should be appreciated that the specific steps illustrated in FIG. 9 provide a particular method of manufacturing an electrical circuit according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An electrical circuit comprising:
   an input operable to receive an AC input voltage;
   a first inductive element coupled to the input and having first and second outputs connected to respective first and second nodes;
   a four-quadrant (4-Q) switch connected between the first and second nodes;
   a capacitor connected between the first node and a third node;
   a second inductive element connected between the third node and the second node;
   a first bidirectional device and a first diode connected in series between a positive output node and a negative output node, wherein a first terminal of the second inductive element is connected to a first conductor between the first bidirectional device and the first diode; and
   a second bidirectional device and a second diode connected in series between the positive output node and the negative output node, wherein a second terminal of the second inductive element is connected to a second conductor between the second bidirectional device and the second diode.

2. The electrical circuit of claim 1 further comprising a control circuit configured to:
   sense the AC input voltage; and
   control the 4-Q switch, the first bidirectional device, and the second bidirectional device such that an input current substantially follows a waveform of the AC input voltage, while regulating the dc voltage at the output terminals.

3. The electrical circuit of claim 1 wherein at least one of the first bidirectional device or the second bidirectional device comprises a field-effect transistor (FET) in series with a diode.

4. The electrical circuit of claim 3 wherein either or both of the FET or the diode comprises at least one of silicon carbide (SiC) or gallium nitride (GaN).

5. The electrical circuit of claim 1 wherein the 4-Q switch comprises:
   a first FET connected between the first node and a fourth node;
   a second FET connected between the second node and the fourth node;
   a third diode connected between the first node and the fourth node; and
   a fourth diode connected between the second node and the fourth node;
   wherein an input of the first FET and an input of the second FET are configured to operate the 4-Q switch.

6. The electrical circuit of claim 1 wherein the 4-Q switch comprises:
   a third diode and a fourth diode connected to the first node;
   a fifth diode and a sixth diode connected to the second node; and a FET connected between:
a node connecting the third diode with the fifth diode, and
a node connecting the fourth diode with the sixth diode;
wherein an input of the FET is configured to operate the 4-Q switch.

7. The electrical circuit of claim 1 wherein:
the second inductive element comprises an inductor connected to each of the second and third nodes.

8. The electrical circuit of claim 1 wherein:
the second inductive element comprises a coupled inductor having:
a first winding connected between the second node and the third node; and
a second winding connected between a fourth node and a fifth node;
wherein:
the fourth node is connected to the first conductor, and
the fifth node is connected to the second conductor.

9. A method of manufacturing an electrical circuit, the method comprising:
providing a first inductive element operable to receive an AC input voltage and having first and second outputs comprising respective first and second nodes;
connecting a four-quadrant (4-Q) switch between the first and second nodes;
connecting a capacitor between the first node and a third node;
connecting a second inductive element between the third node and the second node;
connecting a first bidirectional device and a first diode in series between a positive output node and a negative output node;
connecting a first terminal of the second inductive element to a first conductor between the first bidirectional device and the first diode;
connecting a second bidirectional device and a second diode in series between the positive output node and the negative output node; and
connecting a second terminal of the second inductive element to a first conductor between the second bidirectional device and the second diode.

10. The method of claim 9 further comprising connecting a control circuit to the first inductive element, the 4-Q switch, the first bidirectional device, and the second bidirectional device such that the control circuit is operable to:
sense the AC input voltage; and
control the 4-Q switch, the first bidirectional device, and the second bidirectional device such that an input current substantially follows a waveform of the AC input voltage.

11. The method of claim 9 wherein at least one of the first bidirectional device or the second bidirectional device comprises a field-effect transistor (FET) in series with a diode.

12. The method of claim 11 wherein either or both of the FET or the diode comprises at least one of silicon carbide (SiC) or gallium nitride (GaN).

13. The method of claim 9 wherein the 4-Q switch comprises:
a first FET connected between the first node and a fourth node;
a second FET connected between the second node and the fourth node;
a third diode connected between the first node and the fourth node; and
a fourth diode connected between the second node and the fourth node;
wherein an input of the first FET and an input of the second FET are configured to operate the 4-Q switch.

14. The method of claim 9 wherein the 4-Q switch comprises:
a third diode and a fourth diode connected to the first node;
a fifth diode and a sixth diode connected to the second node; and
a FET coupled between:
a node connecting the third diode with the fifth diode, and
a node connecting the fourth diode with the sixth diode;
wherein an input of the FET is configured to operate the 4-Q switch.

15. The method of claim 9 wherein connecting the second inductive element comprises connecting an inductor between the third node and the second node.

16. The method of claim 9 wherein connecting the second inductive element between the third node and the second node comprises:
connecting a first winding of a coupled inductor between the second node and the third node; and
connecting a second winding of the coupled inductor between a fourth node and a fifth node;
such that:
the fourth node is connected to the first conductor, and
the fifth node is connected to the second conductor.

* * * * *